US006635852B1

(12) United States Patent
Seiwa (10) Patent No.: US 6,635,852 B1
(45) Date of Patent: Oct. 21, 2003

(54) METHOD AND APPARATUS FOR LAMP ANNEAL

(75) Inventor: Akinobu Seiwa, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/096,497

(22) Filed: Jun. 12, 1998

(30) Foreign Application Priority Data

Jun. 12, 1997 (JP) ............................................. 9-155093

(51) Int. Cl.[7] .................................................. F27B 5/14
(52) U.S. Cl. ...................... 219/390; 219/411; 118/725; 392/416
(58) Field of Search ............................ 219/390, 411, 219/413, 405; 392/416, 418; 118/725, 728, 724, 50.1; 374/179

(56) References Cited

U.S. PATENT DOCUMENTS

| 3,836,751 A | * | 9/1974 | Anderson | 219/411 |
| 4,680,451 A | * | 7/1987 | Gat et al. | 219/411 |
| 5,315,092 A | * | 5/1994 | Takahashi et al. | 219/497 |
| 5,456,757 A | * | 10/1995 | Aruga et al. | 118/723 |
| 5,539,855 A | * | 7/1996 | Takahashi et al. | 392/416 |
| 5,756,964 A | * | 5/1998 | Hsu et al. | 219/392 |
| 5,766,363 A | * | 6/1998 | Mizuno et al. | 118/725 |
| 5,837,555 A | * | 11/1998 | Kaltenbrunner et al. | 437/248 |
| 5,951,896 A | * | 9/1999 | Mahawili | 219/411 |

FOREIGN PATENT DOCUMENTS

| JP | 61-198735 | * | 9/1986 |
| JP | 3-210784 | * | 9/1991 |
| JP | 4-82215 | * | 3/1992 |
| JP | 4-148545 | * | 5/1992 |
| JP | 7-221154 | * | 8/1995 |
| JP | 7-316811 | * | 12/1995 |

* cited by examiner

Primary Examiner—Teresa Walberg
Assistant Examiner—Shawntina J. Fuqua
(74) Attorney, Agent, or Firm—Young & Thompson (57) ABSTRACT

The present invention provides a lamp anneal apparatus comprising: a chamber; a wafer holder accommodated in the chamber for holding a wafer to be annealed; a first set of lamps provided over a top wall of the chamber; and a second set of lamps provided under a bottom wall of the chamber, wherein the wafer holder has a plurality of contact temperature sensors which are positioned under the wafer so that the contact temperature sensors receive substantially no radiation from lamps, and the contact temperature sensors are in contact with a bottom surface of the wafer for supporting the wafer and detecting temperatures at different points of the wafer.

31 Claims, 8 Drawing Sheets

METHOD AND APPARATUS FOR LAMP ANNEAL

BACKGROUND OF THE INVENTION

The present invention relates to a method and an apparatus for a lamp anneal, and more particularly to a method and an apparatus for a lamp anneal in order to form an ohmic contact between a semiconductor wafer and a metal thin film provided on the semiconductor wafer as well as a method and an apparatus for a lamp anneal in order to activate ions implanted into a semiconductor wafer.

Lamp anneals have widely been used to form an ohmic contact between a semiconductor wafer and a metal thin film provided on the semiconductor wafer or to activate ions implanted into a semiconductor wafer without, however, any excess diffusion of the implanted ions.

As the size of the semiconductor wafer is increased, a temperature difference between a center portion and a peripheral portion of the semiconductor wafer in a lamp annealing process is likely to be increased. In Japanese Laid-open Patent Publication No. 61-198735, there is disclosed a lamp anneal, wherein a plurality of ring-shaped lamps are co-axially aligned and provided over the semiconductor wafer and also a plurality of temperature sensors are provided at a center portion of the semiconductor wafer and peripheral portions thereof, in addition intermediate portions between the center portion and the peripheral portions so as to individually detect temperatures of the center portion, the intermediate portions and the peripheral portions of the wafer, whereby power to be supplied to the individual co-axially aligned and ring-shaped lamps is independently controlled based upon signals indicating the detected individual temperatures.

Since, however, a stage for holding the wafer is normal stage, it is required to attach a plurality of the temperature sensors onto a surface of the wafer each time the wafer on the stage is replaced.

If contact temperature sensors are attached onto the surface of the wafer, this raises problems with both deterioration in workability due to complicated operations or works for attachment of the contact temperature sensors and variation in position of the attached contact temperature sensors over the surface of the wafer. Further, another problem is raised with a possibility of damaging semiconductor devices integrated on the wafer due to contact between the contact temperature sensors and the semiconductor devices.

Since, further, the contact temperature sensors are attached onto the wafer surface which faces the lamps to be used for annealing, the attached contact temperature sensors are thus exposed directly to radiation from the lamps, thereby making it difficult for the contact temperature sensors to detect temperatures accurately.

On the other hand, if a plurality of radiation thermometers as temperature sensors are provided on the wafer surface, then a large area or a large space is required thereby making it difficult to monitor plural positions of the wafer surface. These radiation thermometers do not conduct a direct measurement of the temperature of the wafer, for which reason values indicated by the radiation thermometers may be varied dependent upon the surface state of the wafer. This means it difficult for the radiation thermometers to detect accurately the actual temperature of the wafer for power control of the lamps.

A susceptor may be used for subjecting a large size wafer such as 8-inches wafer to an anneal for formation of an ohmic contact or an activation of ions implanted. In this case, it may be required to conduct different controls in a direction along which the susceptor is carried into or out in view of relationships between the center and peripheral portions of the wafer. The above co-axial alignment of the ring-shaped lamps is incapable of conducting the different controls in the direction along which the susceptor is put into or out.

In the above circumstances, it had been required to develop a novel method and apparatus for a lamp anneal free from the above problems.

SUMMARY OF THE INVENTION

Accordingly, it is an object of the present invention to provide a novel apparatus for a lamp anneal free from the above problems.

It is a further object of the present invention to provide a novel apparatus for a lamp anneal capable of improvement in workability.

It is a still further object of the present invention to provide a novel apparatus for a lamp anneal capable of accurately detecting temperatures of various points of the wafer for realizing a uniformity in temperature over the wafer.

It is yet a further object of the present invention to provide a novel method for a lamp anneal free from the above problems.

It is furthermore an object of the present invention to provide a novel method for a lamp anneal capable of accurate control of power to be supplied to individual positions of a large size wafer.

The present invention provides a lamp anneal apparatus comprising: a chamber; a wafer holder accommodated in the chamber for holding a wafer to be annealed; a first set of lamps provided over a top wall of the chamber; and a second set of lamps provided under a bottom wall of the chamber, wherein the wafer holder has a plurality of contact temperature sensors which are positioned under the wafer so that the contact temperature sensors receive substantially no radiation from lamps, and the contact temperature sensors are in contact with a bottom surface of the wafer for supporting all of the wafer's weight and detecting temperatures at different points of the wafer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first aspect of the present invention provides a wafer holder provided in a lamp anneal apparatus for holding a wafer. The wafer holder has a plurality of contact temperature sensors which are positioned under the wafer so that the contact temperature sensors receive substantially no radiation from lamps. The contact temperature sensors are in contact with a bottom surface of the wafer for supporting the wafer and detecting temperatures at different points of the wafer.

It is preferable that the contact temperature sensors are electrically connected through a controller to the lamps to transmit signals indicating detected temperatures to the controller so that powers to be supplied to the lamps are controlled by the controller on the basis of the signals from the contact temperature sensors. In this case, it is further preferable that the controller independently controls individual powers to be supplied to the lamps on the basis of individual signals from the contact temperature sensors which individually detect temperatures the wafer at individual points onto which the lamps individually radiate. In this case, it is furthermore preferable that the controller comprises a signal controller connected through signal transmission lines to the contact temperature sensors for controlling signals, and a power controller connected to the signal controller and also connected through power transmission lines to the lamps for controlling powers to be supplied through the power transmission lines to the lamps on the basis of signals controlled by the signal controller.

It is also preferable that the wafer holder comprises a susceptor.

It is also preferable that the wafer holder comprises a pedestal.

The second aspect of the present invention provides an alignment structure of lamps provided over a top wall of a chamber of a lamp anneal apparatus, wherein the lamps are rod-shaped and aligned in parallel to each other within a single plane parallel to the top wall of the chamber.

The third aspect of the present invention provides an alignment structure of lamps provided over a top wall of a chamber of a lamp anneal apparatus, wherein the lamps are rod-shaped and the alignment structure comprises a first level alignment and a second level alignment over the first level alignment, the first level alignment aligns the lamps in parallel to each other within a first level plane parallel to the top wall of the chamber so that the lamps extends in a first direction included in the first level plane, and the second level alignment aligns the lamps in parallel to each other within a second level plane parallel to the top wall of the chamber so that the lamps extends in a second direction perpendicular to the first direction and included in the second level plane to form a multi-level meshed structure of the lamps.

The fourth aspect of the present invention provides a lamp anneal apparatus comprising: a chamber; a wafer holder accommodated in the chamber for holding a wafer to be annealed; a first set of lamps provided over a top wall of the chamber; and a second set of lamps provided under a bottom wall of the chamber, wherein the wafer holder has a plurality of contact temperature sensors which are positioned under the wafer so that the contact temperature sensors receive substantially no radiation from lamps, and the contact temperature sensors are in contact with a bottom surface of the wafer for supporting the wafer and detecting temperatures at different points of the wafer.

It is preferable that the contact temperature sensors are electrically connected through a controller to the lamps to transmit signals indicating detected temperatures to the controller so that powers to be supplied to the lamps are controlled by the controller on the basis of the signals from the contact temperature sensors. In this case, it is further preferable that the controller independently controls individual powers to be supplied to the lamps on the basis of individual signals from the contact temperature sensors which individually detect temperatures the wafer at individual points onto which the lamps individually radiate. In this case, it is furthermore preferable that the controller comprises a signal controller connected through signal transmission lines to the contact temperature sensors for controlling signals, and a power controller connected to the signal controller and also connected through power transmission lines to the lamps for controlling powers to be supplied through the power transmission lines to the lamps on the basis of signals controlled by the signal controller.

It is also preferable that the wafer holder comprises a susceptor.

It is also preferable that the wafer holder comprises a pedestal.

It is also preferable that the lamps of the first set are rod-shaped and aligned in parallel to each other within a single plane parallel to the top wall of the chamber.

It is also preferable that the lamps of the second set are rod-shaped and aligned in parallel to each other within a single plane parallel to the top wall of the chamber.

It is also preferable that the lamps of the first set are rod-shaped and the alignment structure comprises a first level alignment and a second level alignment over the first level alignment, the first level alignment aligns the lamps in parallel to each other within a first level plane parallel to the top wall of the chamber so that the lamps extends in a first direction included in the first level plane, and the second level alignment aligns the lamps in parallel to each other within a second level plane parallel to the top wall of the chamber so that the lamps extends in a second direction perpendicular to the first direction and included in the second level plane to form a multi-level meshed structure of the lamps.

The fifth aspect of the present invention provides a lamp anneal apparatus comprising: a chamber; a wafer holder accommodated in the chamber for holding a wafer to be annealed; a first set of lamps provided over a top wall of the chamber; and a second set of lamps provided under a bottom wall of the chamber. The lamps of the second set are rod-shaped and aligned in parallel to each other within a single plane parallel to the top wall of the chamber. The wafer holder has a plurality of contact temperature sensors which are positioned under the wafer so that the contact temperature sensors receive substantially no radiation from lamps, and the contact temperature sensors are in contact with a bottom surface of the wafer for supporting the wafer and detecting temperatures at different points of the wafer. The contact temperature sensors are electrically connected through a controller to the lamps to transmit signals indicating detected temperatures to the controller so that powers to be supplied to the lamps are controlled by the controller on the basis of the signals from the contact temperature sensors, and the controller independently controls individual powers to be supplied to the lamps on the basis of individual signals from the contact temperature sensors which individually detect temperatures the wafer at individual points onto which the lamps individually radiate.

It is preferable that the controller comprises a signal controller connected through signal transmission lines to the contact temperature sensors for controlling signals, and a power controller connected to the signal controller and also connected through power transmission lines to the lamps for controlling powers to be supplied through the power transmission lines to the lamps on the basis of signals controlled by the signal controller.

It is also preferable that the wafer holder comprises a susceptor.

It is also preferable that the wafer holder comprises a pedestal.

The sixth aspect of the present invention provides a lamp anneal apparatus comprising: a chamber; a wafer holder accommodated in the chamber for holding a wafer to be annealed; a first set of lamps provided over a top wall of the chamber; and a second set of lamps provided under a bottom wall of the chamber. The lamps of the first set are rod-shaped and the alignment structure comprises a first level alignment and a second level alignment over the first level alignment, the first level alignment aligns the lamps in parallel to each other within a first level plane parallel to the top wall of the chamber so that the lamps extends in a first direction included in the first level plane, and the second level alignment aligns the lamps in parallel to each other within a second level plane parallel to the top wall of the chamber so that the lamps extends in a second direction perpendicular to the first direction and included in the second level plane to form a multi-level meshed structure of the lamps. The wafer holder has a plurality of contact temperature sensors which are positioned under the wafer so that the contact temperature sensors receive substantially no radiation from lamps, and the contact temperature sensors are in contact with a bottom surface of the wafer for supporting the wafer and detecting temperatures at different points of the wafer. The contact temperature sensors are electrically connected through a controller to the lamps to transmit signals indicating detected temperatures to the controller so that powers to be supplied to the lamps are controlled by the controller on the basis of the signals from the contact temperature sensors, and the controller independently controls individual powers to be supplied to the lamps on the basis of individual signals from the contact temperature sensors which individually detect temperatures the wafer at individual points onto which the lamps individually radiate.

It is preferable that the controller comprises a signal controller connected through signal transmission lines to the contact temperature sensors for controlling signals, and a power controller connected to the signal controller and also connected through power transmission lines to the lamps for controlling powers to be supplied through the power transmission lines to the lamps on the basis of signals controlled by the signal controller.

It is also preferable that the wafer holder comprises a susceptor.

Figure 1A:
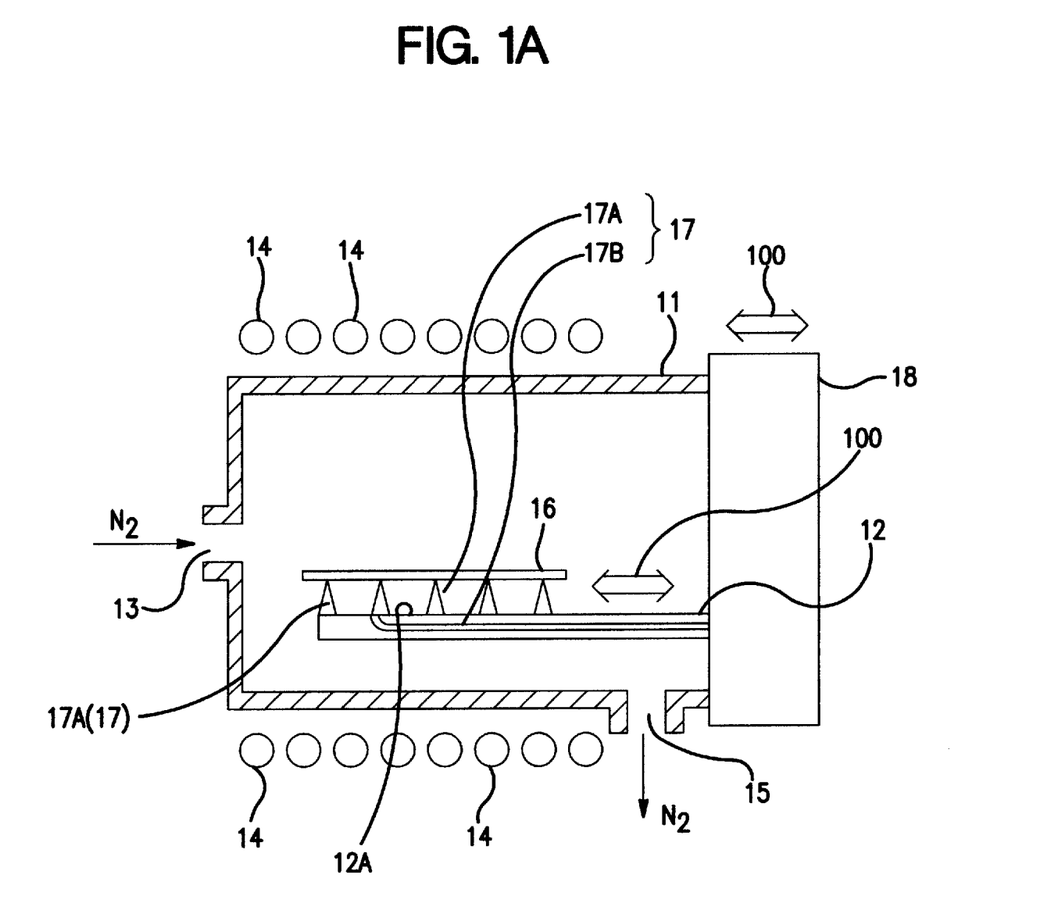
FIG. 1A is a schematic view illustrative of a novel apparatus for a lamp anneal in a first embodiment in accordance with the present invention.
Figure 1B:
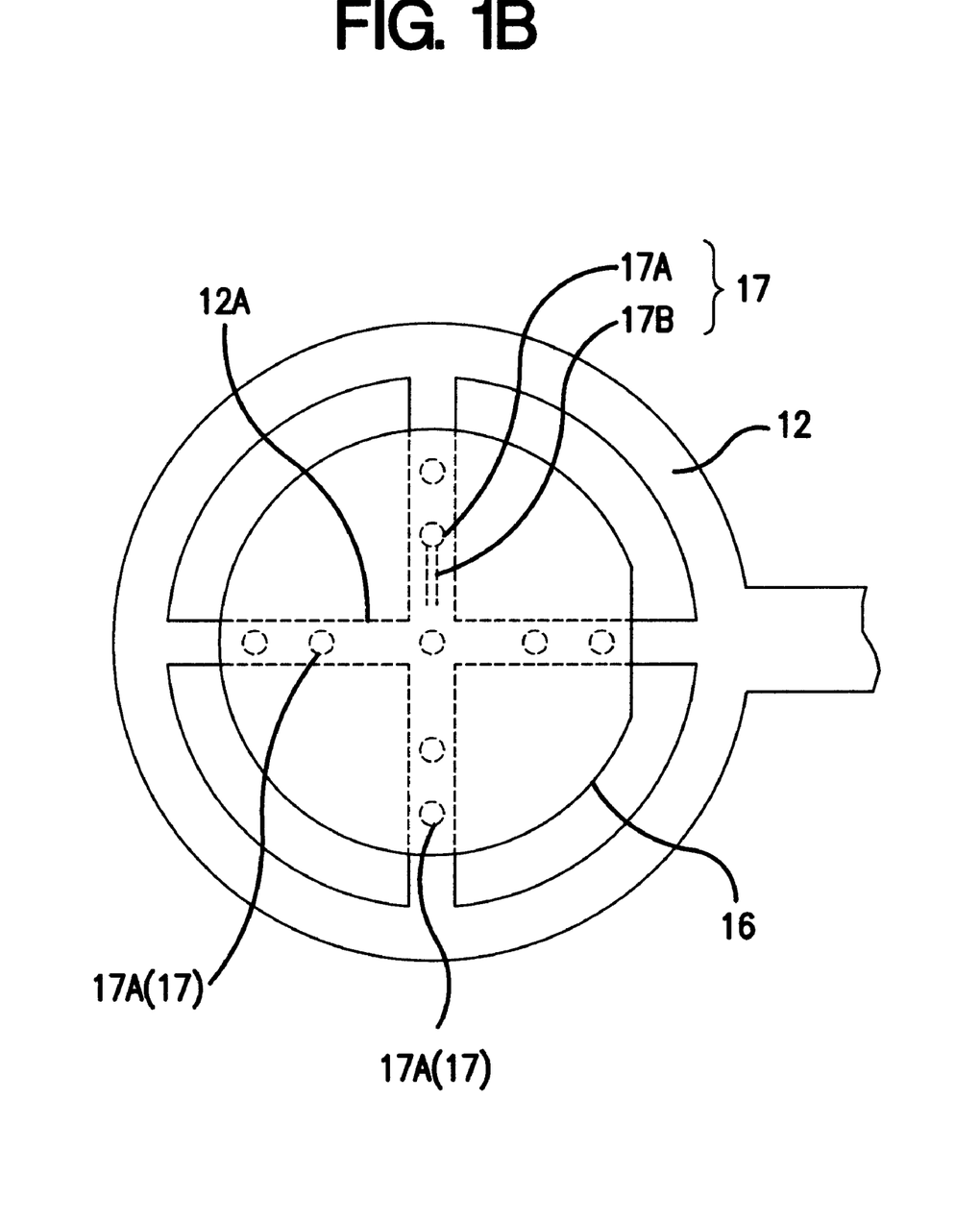
FIG. 1B is a plan view illustrative of a wafer placed on a susceptor provided in a novel apparatus for a lamp anneal in a first embodiment in accordance with the present invention.

It is also preferable that the wafer holder comprises a pedestal. Reconsideration and withdrawal of this rejection are respectfully requested for the following reasons:

First Embodiment:

A first embodiment according to the present invention will be described in detail with reference to FIGS. 1A and 1B, wherein a novel apparatus for a lamp anneal is provided.

The lamp anneal apparatus has a susceptor 12 made of a material such as silicon carbide having a high heat resistivity and a high heat conductivity. The susceptor 12 has a wafer mounting surface 12A on which a wafer 16 is mounted. The susceptor 12 also has a plurality of contact temperature sensors such as thermocouples 17. Each of the thermocouples 17 comprises a temperature detecting portion 17A projected upwardly from the wafer mounting surface 12A of the susceptor 12 and a buried portion 17B buried in the susceptor 12, wherein the temperature detecting portion 17A is to detect a temperature of the wafer 16 at a high sensitivity, whilst the buried portion 17B is to transmit signals detected by the temperature detecting portion 17A. The wafer 16 is mounted on the plural thermocouples 17 so that the temperature detecting portions 17A of the plural thermocouples 17 are in contact with different points on the bottom surface of the wafer 16.

The lamp anneal apparatus also has a chamber 11 which is made of quartz. The chamber 11 has one side which is closed with a side plate 18. The susceptor 12 is mechanically supported by the side plate 18. The susceptor 12 is movable in a direction along an arrow mark 100 so that the wafer 16 is carried into the chamber 11 and then the wafer 16 is kept during the annealing process and for subsequent removal from the chamber 11.

Figure 2:
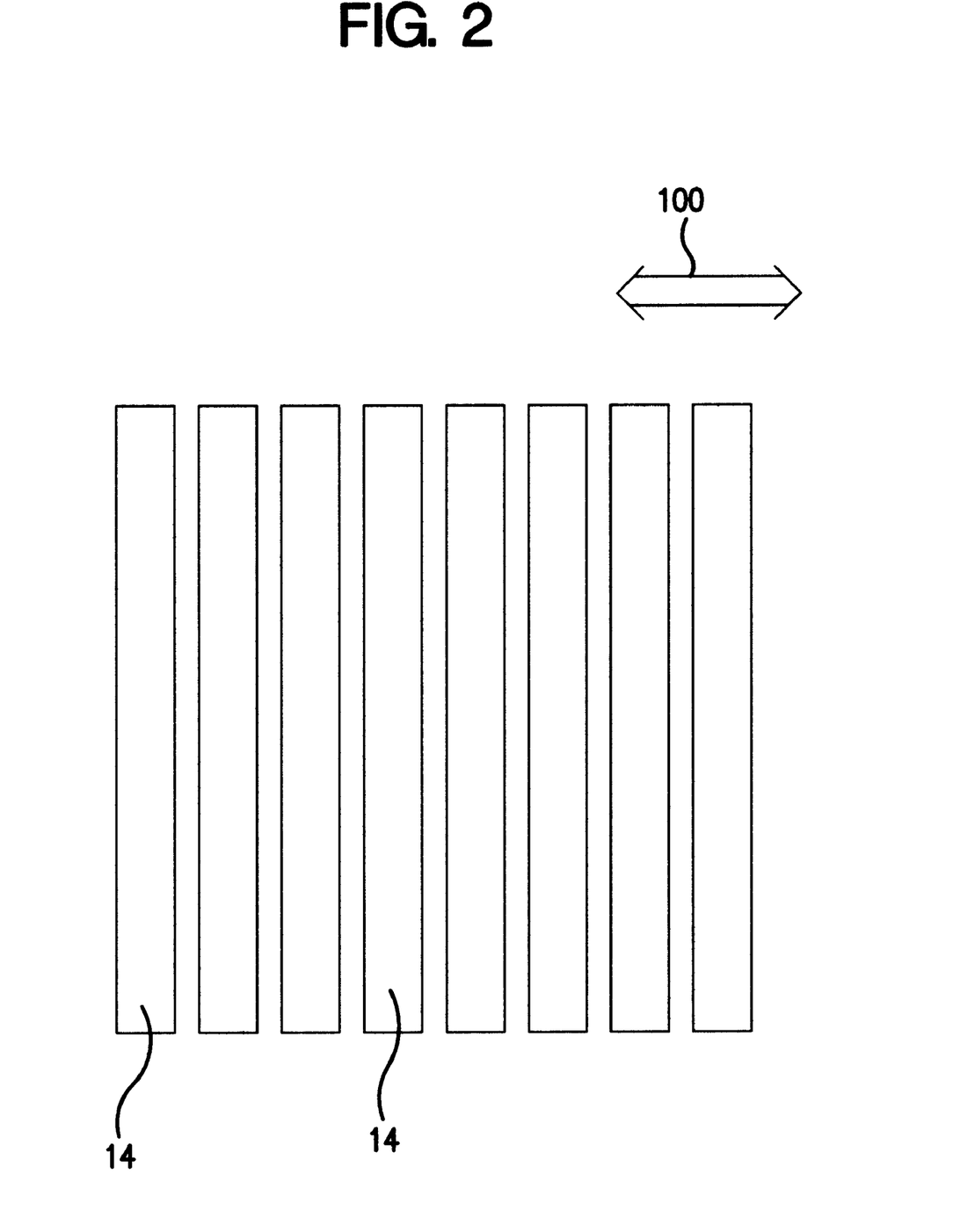
FIG. 2 is a schematic plan view illustrative of a plurality of rod-shaped lamps aligned in a direction of an arrow mark direction in a first embodiment in accordance with the present invention.

A first set of rod-shaped lamps 14 are provided over a top wall of the chamber 11 so that the plural rod-shaped lamps 14 extend in parallel to the top wall of the chamber 11 but in a direction perpendicular to the arrow mark direction. Namely, the plural rod-shaped lamps 14 are aligned in parallel to each other and in the direction perpendicular to the arrow mark direction. FIG. 2 is a schematic plan view illustrative of a plurality of rod-shaped lamps aligned in a direction of an arrow mark direction. A second set of rod-shaped lamps 14 are also provided under a bottom wall of the chamber 11 so that the plural rod-shaped lamps 14 extend in parallel to the bottom wall of the chamber 11 but in a direction perpendicular to the arrow mark direction. Namely, the plural rod-shaped lamps 14 are aligned in parallel to each other and in the direction perpendicular to the arrow mark direction as illustrated in FIG. 2.

In the annealing process, the plural thermocouples 17 detect temperatures of different points of the wafer 16 so that power to be supplied to the individual rod-shaped lamps 14 is individually controlled based upon the detected temperature information from the plural thermo-couples 17 in order to individually control radiation thermal quantity from the lamps positioned in correspondence to the temperature-detected points of the wafer so that the individual points of the wafer 16 are maintained at individually predetermined temperatures, for example, so that all parts of the wafer 16 are maintained at a uniform temperature. Namely, the powers to be supplied to the individual rod-shaped lamps 14 are controlled on the basis of the temperature-detected informations from the corresponding points receiving the individual radiations from the individual rod-shaped lamps 14.

Figure 3:
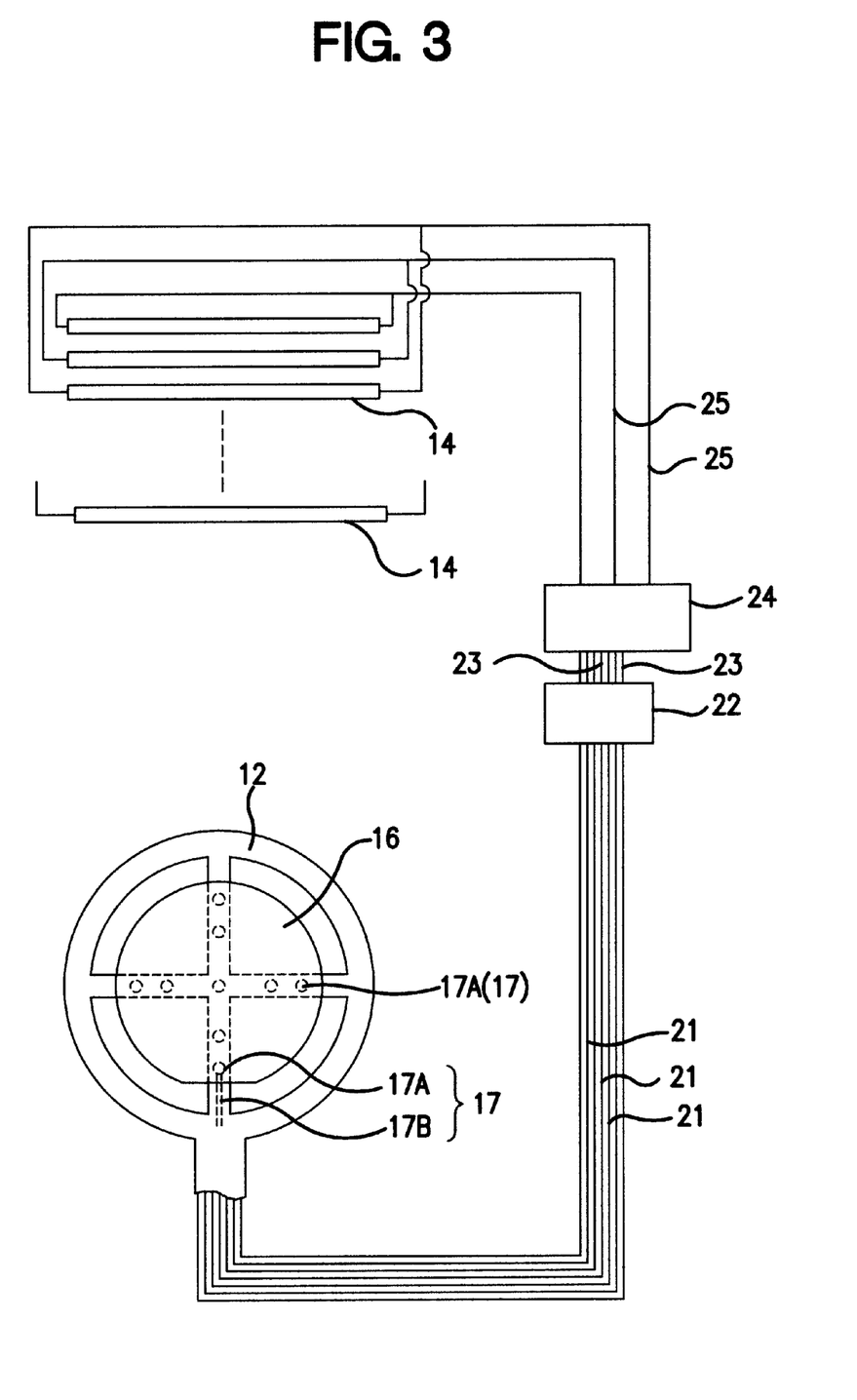
FIG. 3 is a schematic diagram illustrative of a control system of the novel lamp anneal apparatus in a first embodiment in accordance with the present invention.

FIG. 3 is a schematic diagram illustrative of a control system of the above novel lamp anneal apparatus. The control system of the above novel lamp anneal apparatus has the following structure. The temperature detecting portions 17A of the thermo-couples 17 are connected through the buried portions 17B thereof to first signal transmission lines 21 to a controller 22 so that the temperature detected signals are transmitted through the first signal transmission lines 21 to the controller 22. The controller 22 is further connected through second signal transmission lines 23 to a power controller 24 so that the signals are further transmitted through the second signal transmission lines 23 to the power controller 24. The power controller 24 is operated to control powers in accordance with the received informations of the temperature-detected signals. The power controller 24 is connected through power transmission lines 25 to the individual rod-shaped lamps 14 aligned over the top wall and under the bottom wall of the chamber 11 so that the controlled powers are supplied through the power transmission lines 25 to the individual rod-shaped lamps 14.

In this embodiment, the lamp 14 positioned at the center may be connected to receive the temperature-detected signals from five of the thermo-couples 17 so that a power to be supplied to the center lamp 14 is controlled based upon the average of the temperature-detected signals from five of the thermocouples 17.

Figure 4A:
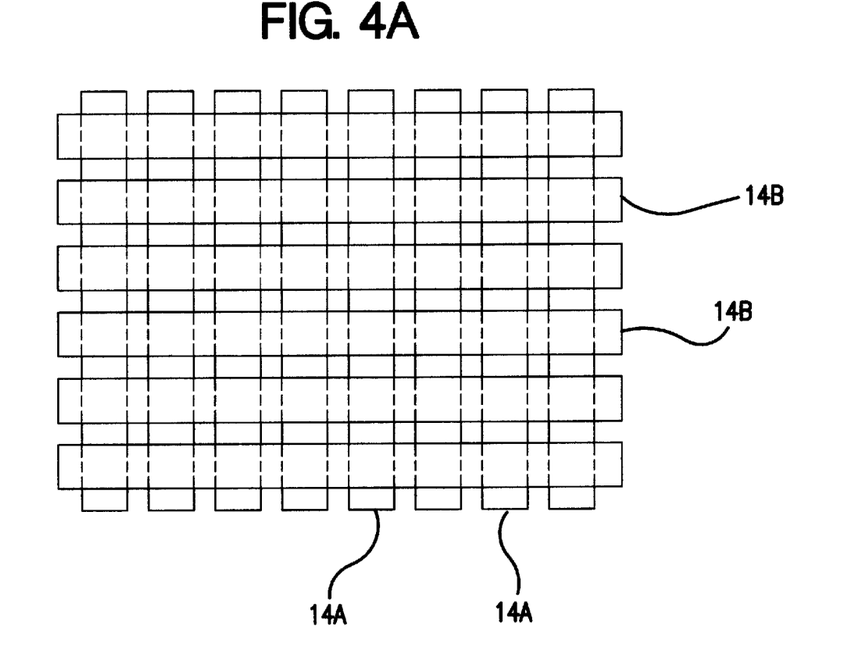
FIG. 4A is a schematic plan view illustrative of two different level alignments of rod-shaped lamps aligned in different directions perpendicular to each other in a modification to a first embodiment in accordance with the present invention.
Figure 4B:
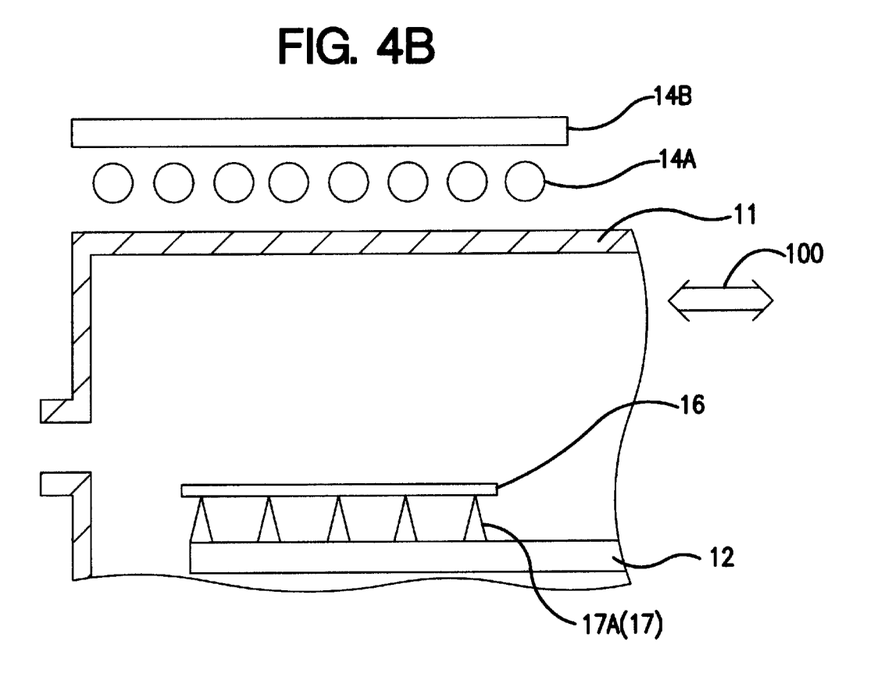
FIG. 4B is a schematic view illustrative of a novel apparatus for a lamp anneal having two different level alignments of rod-shaped lamps aligned in different directions perpendicular to each other in a modification to a first embodiment in accordance with the present invention.

In place of the single alignment of the rod-shaped lamps 14 in the arrow mark direction as illustrated in FIG. 2, it is also possible to modify alignments of the rod-shaped lamps 14 as illustrated in FIGS. 4A and 4B. Namely, there are two level alignments of the rod-shaped lamps 14, which comprises a lower level alignment of rod-shaped lamps 14A and a higher level alignment of rod-shaped lamps 14B overlying the lower level alignment of the rod-shaped lamps 14A. The rod-shaped lamps 14A are aligned in parallel to each other and in a direction along the arrow mark direction 100, wherein each of the rod-shaped lamps 14A extends in a direction perpendicular to the arrow mark direction 100. The rod-shaped lamps 14B are aligned in parallel to each other and in a direction perpendicular to the arrow mark direction 100, wherein each of the rod-shaped lamps 14B extends in the arrow mark direction 100. Namely, each of the rod-shaped lamps 14B extends perpendicular to the direction along which the rod-shaped lamps 14A extend. As a result, temperatures of the various points of the wafer 16 are determined by combination of the rod-shaped lamps 14A and the rod-shaped lamps 14B. This means it possible to conduct a two-dimensional temperature control in matrix of all parts of the wafer 16.

Operations of the above novel lamp anneal apparatus will subsequently be described with reference again to FIG. 1. The wafer 16 is carried onto the wafer mounting surface 12A of the susceptor 12 by a robot arm, wherein the wafer 16 has been formed with an orientation flat. The wafer 16 placed or mounted on the susceptor 12 is then carried into the chamber 11 together with the susceptor 12. The susceptor 12 moves in the arrow mark direction 100.

The wafer 16 in the chamber 11 is annealed at a constant temperature for a predetermined time period by the lamps 14. Normally, in the anneal sequence the temperature is increased from 200–300° C. up to 1000° C. to anneal the wafer for about one minute. After the annealing process has been completed, then the wafer 16 is carried out from the chamber 11 together with the susceptor 14 before the wafer 16 is then picked up from the susceptor 14 by the robot arm.

During the annealing process, a fresh inert gas such as nitrogen gas is continuously supplied through a gas introduction port 13 of the chamber 11 whilst the old gas in the chamber 11 is continuously discharged from a gas discharge port 15 of the chamber 11 so as to prevent introduction of an oxygen atmosphere into the chamber 11.

Figure 5:
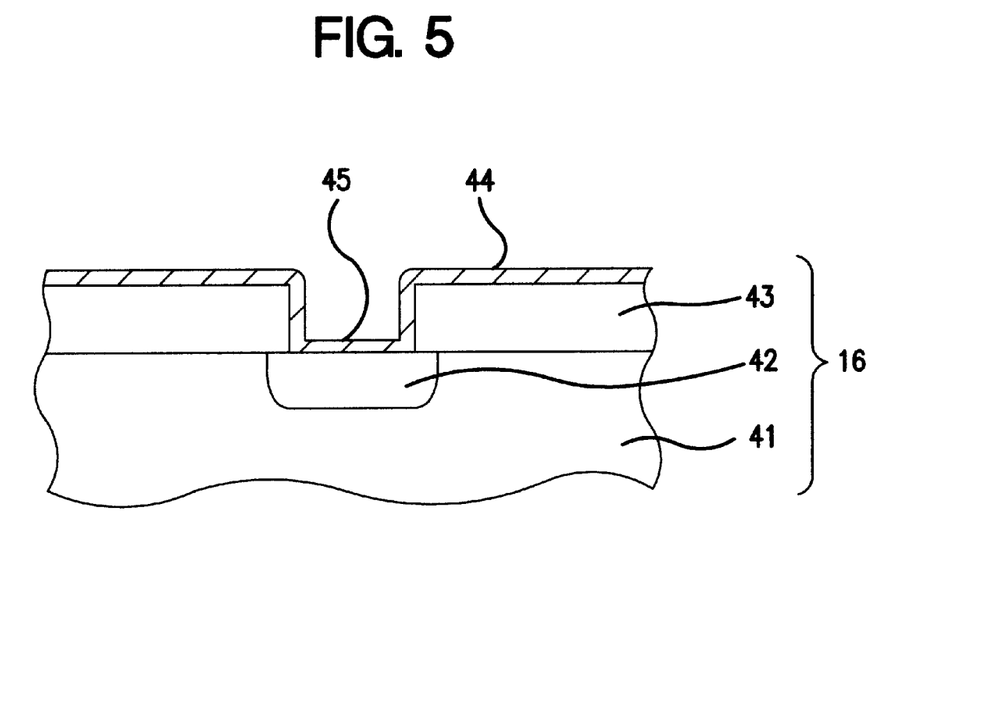
FIG. 5 is a fragmentary cross sectional elevation view illustrative of a semiconductor wafer having an ohmic contact between a diffusion region and a metal thin film.

The above novel lamp anneal apparatus may be used for forming an ohmic contact between the metal layer with the diffusion region in the semiconductor wafer 16. FIG. 5 is a fragmentary cross sectional elevation view illustrative of a semiconductor wafer having an ohmic contact between a diffusion region and a metal thin film. A diffusion region 42 is selectively formed in an upper region of a silicon substrate 41. An insulation layer 43 is provided which extends over parts of the diffusion region 42 and the top surface of the silicon substrate 41. The insulation layer 43 has an opening which positioned over the diffusion region 42. A metal layer 44 is entirely deposited over the insulation layer 43 and over the top surface of the diffusion region 46. An ohmic contact is formed by annealing the wafer 16 between the metal thin film 44 and the diffusion region 42.

Figure 6:
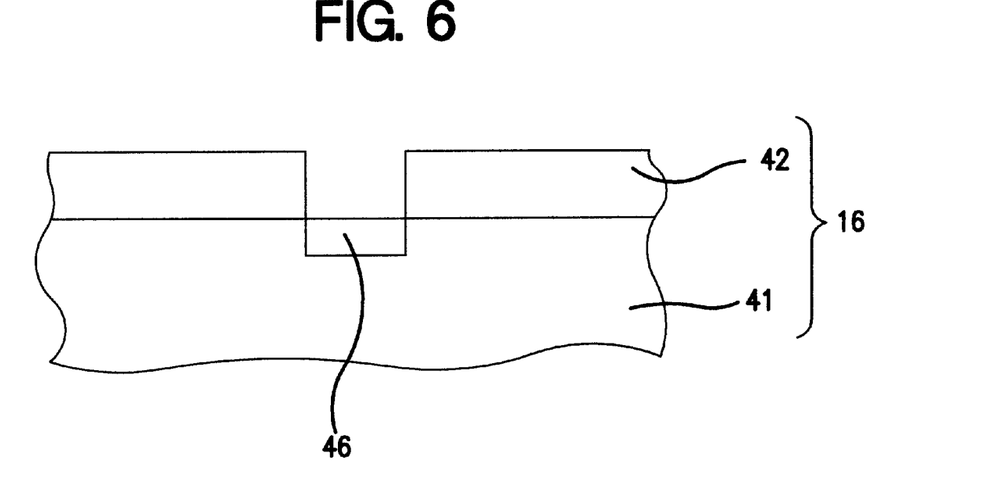
FIG. 6 is a fragmentary cross sectional elevation view illustrative of a semiconductor wafer having a diffusion region with electrically activated ions.

Alternatively, the above novel lamp anneal apparatus may be used for causing an activation of ions diffused into a diffusion region in a semiconductor wafer. FIG. 6 is a fragmentary cross sectional elevation view illustrative of a semiconductor wafer having a diffusion region with electrically activated ions. A diffusion region 46 is selectively formed in an upper region of a silicon substrate 41. An insulation layer 42 is provided which extends over the top surface of the silicon substrate 41. The insulation layer 43 has an opening which positioned over the diffusion region 46. An electrical activation of ions diffused into the diffusion region 46 is caused by the above annealing process.

Figure 7A:
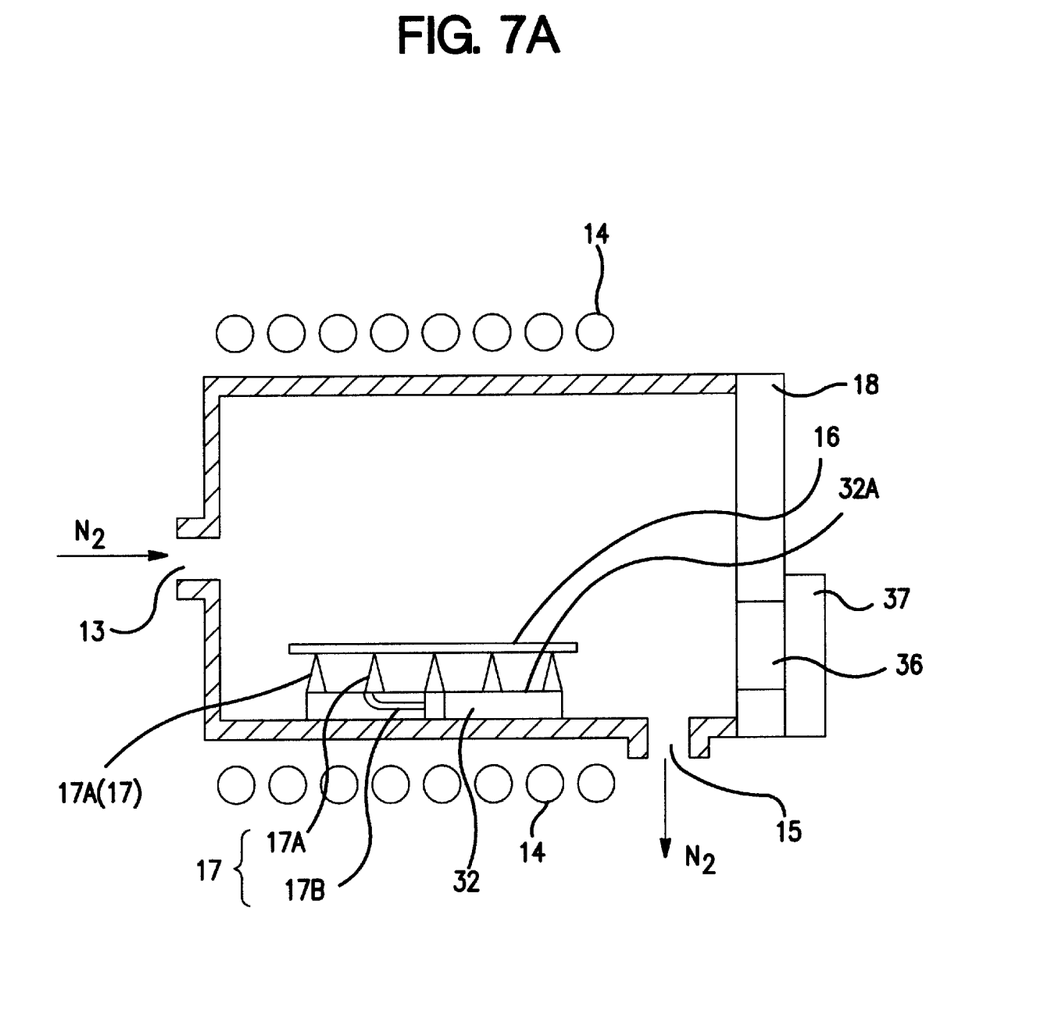
FIG. 7A is a schematic view illustrative of a novel apparatus for a lamp anneal in a second embodiment in accordance with the present invention.
Figure 7B:
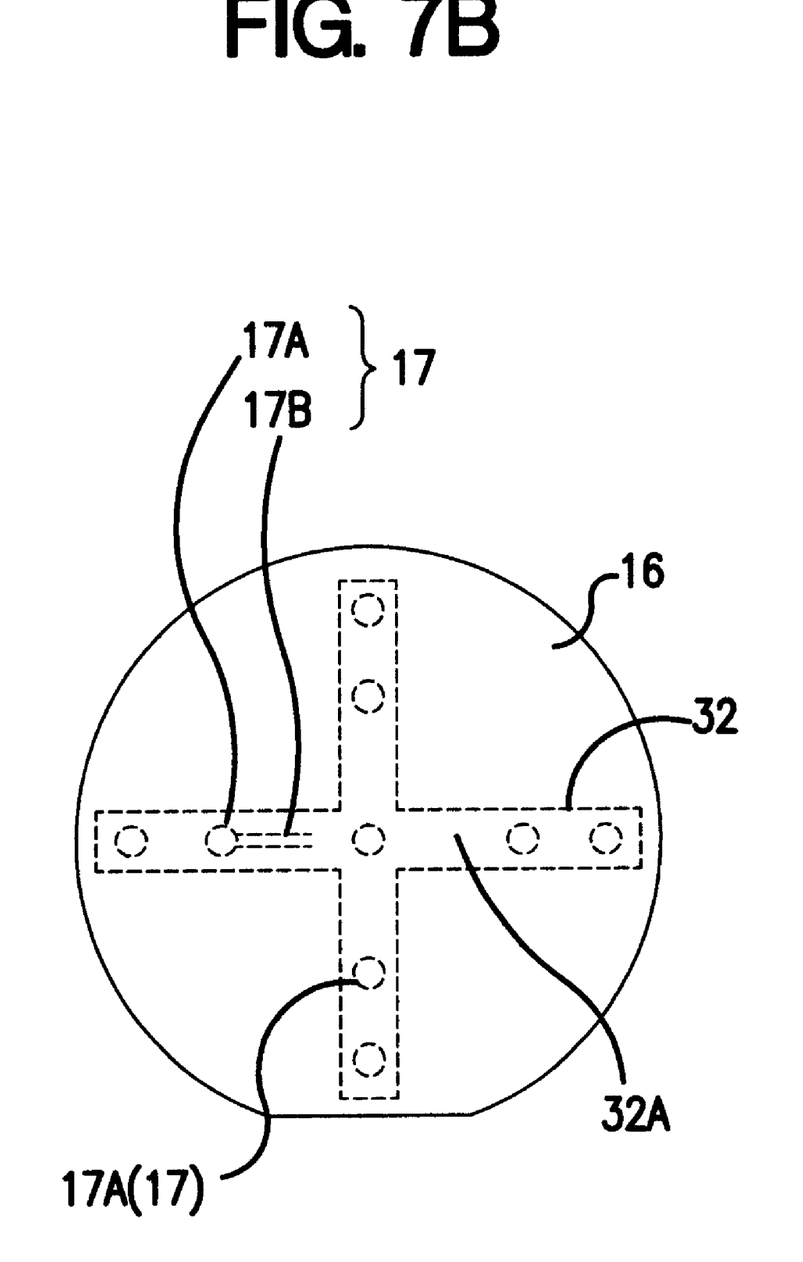
FIG. 7B is a plan view illustrative of a wafer placed on a pedestal provided in a novel apparatus for a lamp anneal in a second embodiment in accordance with the present invention.

Second Embodiment:

A second embodiment according to the present invention will be described in detail with reference to FIGS. 7A and 7B, wherein a novel apparatus for a lamp anneal is provided.

The lamp anneal apparatus has a pedestal 32 made of a material such as silicon carbide having a high heat resistivity and a high heat conductivity. The pedestal 32 is fixed on an inner surface of a bottom wall of a chamber 11. The pedestal 32 has a wafer mounting surface 32A on which a wafer 16 is mounted. The pedestal 32 also has a plurality of contact temperature sensors such as thermocouples 17. Each of the thermocouples 17 comprises a temperature detecting portion 17A projected upwardly from the wafer mounting surface 32A of the pedestal 32 and a buried portion 17B buried in the pedestal 32, wherein the temperature detecting portion 17A is to detect a temperature of the wafer 16 at a high sensitivity, whilst the buried portion 17B is to transmit signals detected by the temperature detecting portion 17A. The wafer 16 is mounted on the plural thermocouples 17 so that the temperature detecting portions 17A of the plural thermocouples 17 are in contact with different points on the bottom surface of the wafer 16.

The lamp anneal apparatus also has the chamber 11 which is made of quartz. The chamber 11 has one side which has an opening 36 and an opening door 36 closing the opening 36. Since, as described above, the pedestal 32 is fixed and supported on the bottom wall of the chamber 11, the opening door 37 is opened so that the wafer 16 is carried through the opening 36 into the chamber 11 by a robot arm before the opening door 37 is closed and the wafer 16 is kept during the annealing process. Thereafter, the opening door 37 is again opened so that the wafer 16 is carried through the opening 36 out from the chamber 11 by the robot arm.

A first set of rod-shaped lamps 14 are provided over the top wall of the chamber 11 so that the plural rod-shaped lamps 14 extend in parallel to the top wall of the chamber 11 but in a direction perpendicular to the arrow mark direction. Namely, the plural rod-shaped lamps 14 are aligned in parallel to each other and in the direction perpendicular to the arrow mark direction. A second set of rod-shaped lamps 14 are also provided under the bottom wall of the chamber 11 so that the plural rod-shaped lamps 14 extend in parallel to the bottom wall of the chamber 11 but in a direction perpendicular to the arrow mark direction. Namely, the plural rod-shaped lamps 14 are aligned in parallel to each other and in the direction perpendicular to the arrow mark direction.

In the annealing process, the plural thermocouples 17 detect temperatures of different points of the wafer 16 so that powers to be supplied to the individual rod-shaped lamps 14 are individually controlled based upon the detected temperature informations from the plural thermocouples 17 in order to individually control radiation thermal quantity from the lamps positioned in correspondence to the temperature-detected points of the wafer so that the individual points of the wafer 16 are maintained at individually predetermined temperatures, for example, so that all parts of the wafer 16 are maintained at an uniform temperature. Namely, the power to be supplied to the individual rod-shaped lamps 14 is controlled on the basis of the temperature-detected information from the corresponding points receiving the individual radiations from the individual rod-shaped lamps 14.

The above novel lamp anneal apparatus has a control system substantially the same as in the first embodiment. The temperature detecting portions 17A of the thermocouples 17 are connected through the buried portions 17B thereof to first signal transmission lines to a controller 22 that the temperature detected signals are transmitted through the first signal transmission lines to the controller. The controller is further connected through second signal transmission lines to a power controller so that the signals are further transmitted through the second signal transmission lines to the power controller. The power controller is operated to control powers in accordance with the received informations of the temperature-detected signals. The power controller is connected through power transmission lines to the individual rod-shaped lamps aligned over the top wall and under the bottom wall of the chamber so that the controlled powers are supplied through the power transmission lines to the individual rod-shaped lamps.

In this embodiment, it may be possible that the lamp 14 positioned at the center is connected to receive the temperature-detected signals from five of the thermocouples 17 so that a power to be supplied to the center lamp 14 is controlled based upon the average of the temperature-detected signals from five of the thermocouples 17.

In place of the single alignment of the rod-shaped lamps 14 in the arrow mark direction, it is also available to modify alignments of the rod-shaped lamps 14 as illustrated in FIGS. 4A and 4B. Namely, there are two level alignments of the rod-shaped lamps 14, which comprises a lower level alignment of rod-shaped lamps 14A and a higher level alignment of rod-shaped lamps 14B overlying the lower level alignment of the rod-shaped lamps 14A. The rod-shaped lamps 14A are aligned in parallel to each other and in a direction along the arrow mark direction 100, wherein each of the rod-shaped lamps 14A extends in a direction perpendicular to the arrow mark direction 100. The rod-shaped lamps 14B are aligned in parallel to each other and in a direction perpendicular to the arrow mark direction 100, wherein each of the rod-shaped lamps 14B extends in the arrow mark direction 100. Namely, each of the rod-shaped lamps 14B extends perpendicular to the direction along which the rod-shaped lamps 14A extend. As a result, temperatures of the various points of the wafer 16 are determined by combination of the rod-shaped lamps 14A and the rod-shaped lamps 14B. This means it possible to conduct a two-dimensional temperature control in matrix of the entire parts of the wafer 16.

Operation of the above novel lamp anneal apparatus will subsequently be described with reference again to FIG. 7A. The opening door 37 is opened so that the wafer 16 is carried through the opening 36 into the chamber 11 by a robot arm before the opening door 37 is closed and the wafer 16 is kept during the annealing process. The wafer 16 in the chamber 11 is annealed at a constant temperature for a predetermined time period by the lamps 14. Normally, in the anneal sequence the temperature is increased from 200–300° C. up to 1000° C. to anneal the wafer for about one minute. After the annealing process has been completed, then the wafer 16 is carried out from the chamber 11 together with the susceptor 14 before the wafer 16 is then picked up from the susceptor 14 by the robot arm. Thereafter, the opening door 37 is again opened so that the wafer 16 is carried through the opening 36 out from the chamber 11 by the robot arm.

During the annealing process, a fresh inert gas such as nitrogen gas is continuously supplied through a gas introduction port 13 of the chamber 11 whilst the old gas in the chamber 11 is continuously discharged from a gas discharge port 15 of the chamber 11 so as to prevent introduction of an oxygen atmosphere into the chamber 11.

The above novel lamp anneal apparatus may be used for forming an ohmic contact between the metal layer with the diffusion region in the semiconductor wafer 16. Alternatively, the above novel lamp anneal apparatus may be used for causing an activation of ions diffused into a diffusion region in a semiconductor wafer.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A wafer holder provided in a lamp anneal apparatus for holding a wafer, said wafer holder having a plurality of contact temperature sensors which are positioned under the wafer so that said contact temperature sensors receive substantially no radiation from lamps, and said contact temperature sensors being in contact with a bottom surface of said wafer for supporting all of said wafer's weight and detecting temperatures at different points of said wafer.

2. The wafer holder as claimed in claim 1, wherein said contact temperature sensors are electrically connected through a controller to said lamps to transmit signals indicating detected temperatures to said controller so that power to be supplied to said lamps is controlled by said controller on the basis of said signals from said contact temperature sensors.

3. The wafer holder as claimed in claim 2, wherein said controller independently controls individual powers to be supplied to said lamps on the basis of individual signals from said contact temperature sensors which individually detect temperatures of said wafer at individual points onto which said lamps individually radiate.

4. The wafer holder as claimed in claim 3, wherein said controller comprises a signal controller connected through signal transmission lines to said contact temperature sensors for controlling signals, and a power controller connected to said signal controller and also connected through power transmission lines to said lamps for controlling power to be supplied through said power transmission lines to said lamps on the basis of signals controlled by said signal controller.

5. The wafer holder as claimed in claim 1, wherein said wafer holder comprises a susceptor.

6. The wafer holder as claimed in claim 1, wherein said wafer holder comprises a pedestal.

7. The wafer holder of claim 1, further comprising a holder base that is positioned under the wafer, each of said temperature sensors having an exposed portion that extends above said holder base to support the wafer and a buried portion that is embedded within said holder base.

8. The wafer holder of claim 7, wherein said temperature sensors are radially arrayed from a center of said holder base and spaced apart to detect temperatures at different radially arrayed points of the wafer.

9. A lamp anneal apparatus comprising:
a chamber;
a wafer holder accommodated in said chamber for holding a wafer to be annealed;
a first set of lamps provided over a top wall of said chamber; and
a second set of lamps provided under a bottom wall of said chamber,
wherein said wafer holder has a plurality of contact temperature sensors which are positioned under the wafer so that said contact temperature sensors receive substantially no radiation from lamps, and said contact temperature sensors are in contact with a bottom surface of said wafer for supporting all of said wafer's weight and detecting temperatures at different points of said wafer.

10. The lamp anneal apparatus as claimed in claim 9, wherein said contact temperature sensors are electrically connected through a controller to said lamps to transmit signals indicating detected temperatures to said controller so that power to be supplied to said lamps is controlled by said controller on the basis of said signals from said contact temperature sensors.

11. The lamp anneal apparatus as claimed in claim 10, wherein said controller independently controls individual power to be supplied to said lamps on the basis of individual signals from said contact temperature sensors which individually detect temperatures of said wafer at individual points onto which said lamps individually radiate.

12. The lamp anneal apparatus as claimed in claim 11, wherein said controller comprises a signal controller connected through signal transmission lines to said contact temperature sensors for controlling signals, and a power controller connected to said signal controller and also connected through power transmission lines to said lamps for controlling power to be supplied through said power transmission lines to said lamps on the basis of signals controlled by said signal controller.

13. The lamp anneal apparatus as claimed in claim 9, wherein said wafer holder comprises a susceptor.

14. The lamp anneal apparatus as claimed in claim 9, wherein said wafer holder comprises a pedestal.

15. The lamp anneal apparatus as claimed in claim 9, wherein said lamps of said first set are rod-shaped and aligned in parallel to each other within a single plane parallel to said top wall of said chamber.

16. The lamp anneal apparatus as claimed in claim 9, wherein said lamps of said second set are rod-shaped and aligned in parallel to each other within a single plane parallel to said top wall of said chamber.

17. The lamp anneal apparatus as claimed in claim 9, wherein said lamps of said first set are rod-shaped and said alignment structure comprises a first level alignment and a second level alignment over said first level alignment, said first level alignment aligns said lamps extend in parallel to each other within a first level plane parallel to said top wall of said chamber so that said lamps extends in a first direction included in said first level plane, and said second level alignment aligns said lamps in parallel to each other within a second level plane parallel to said top wall of said chamber so that said lamps extends in a second direction perpendicular to said first direction and included in said second level plane to form a multi-level meshed structure of said lamps.

18. The lamp anneal apparatus of claim 9, wherein said wafer holder comprises a holder base that is positioned under the wafer, each of said temperature sensors having an exposed portion that extends above said holder base to support the wafer and a buried portion that is embedded within said holder base.

19. The lamp anneal apparatus of claim 18, wherein said temperature sensors are radially arrayed from a center of said holder base and spaced apart to detect temperatures at different radially arrayed points of the wafer.

20. A lamp anneal apparatus comprising:
a chamber;
a wafer holder accommodated in said chamber for holding a wafer to be annealed, wherein said wafer holder has a plurality of contact temperature sensors which are positioned under the wafer so that said contact temperature sensors receive substantially no radiation from lamps, and said contact temperature sensors are in contact with a bottom surface of said wafer for supporting all of said wafer's weight and detecting temperatures at different points of said wafer;
a first set of lamps provided over a top wall of said chamber, wherein said lamps of said first set are rod-shaped and aligned in parallel to each other within a single plane parallel to said top wall of said chamber; and
a second set of lamps provided under a bottom wall of said chamber,
wherein said contact temperature sensors are electrically connected through a controller to said lamps to transmit signals indicating detected temperatures to said controller so that power to be supplied to said lamps are controlled by said controller on the basis of said signals from said contact temperature sensors, and said controller independently controls individual power to be supplied to said lamps on the basis of individual signals from said contact temperature sensors which individually detect temperatures said wafer at individual points onto which said lamps individually radiate.

21. The lamp anneal apparatus as claimed in claim 20, wherein said controller comprises a signal controller connected through signal transmission lines to said contact temperature sensors for controlling signals, and a power controller connected to said signal controller and also connected through power transmission lines to said lamps for controlling powers to be supplied through said power transmission lines to said lamps on the basis of signals controlled by said signal controller.

22. The lamp anneal apparatus as claimed in claim 20, wherein said wafer holder comprises a susceptor.

23. The lamp anneal apparatus as claimed in claim 20, wherein said wafer holder comprises a pedestal.

24. The lamp anneal apparatus of claim 20, wherein said wafer holder comprises a holder base that is positioned under the wafer, each of said temperature sensors having an exposed portion that extends above said holder base to support the wafer and a buried portion that is embedded within said holder base.

25. The lamp anneal apparatus of claim 24, wherein said temperature sensors are radially arrayed from a center of said holder base and spaced apart to detect temperatures at different radially arrayed points of the wafer.

26. A lamp anneal apparatus comprising:

a chamber;

a wafer holder accommodated in said chamber for holding a wafer to be annealed, wherein said wafer holder has a plurality of contact temperature sensors which are positioned under the wafer so that said contact temperature sensors receive substantially no radiation from lamps, and said contact temperature sensors are in contact with a bottom surface of said wafer for supporting all of said wafer's weight and detecting temperatures at different points of said wafer;

a first set of lamps provided over a top wall of said chamber, wherein said lamps of said first set are rod-shaped and said alignment structure comprises a first level alignment and a second level alignment over said first level alignment, said first level alignment aligns said lamps in parallel to each other within a first level plane parallel to said top wall of said chamber so that said lamps extends in a first direction included in said first level plane, and said second level alignment aligns said lamps in parallel to each other within a second level plane parallel to said top wall of said chamber so that said lamps extend in a second direction perpendicular to said first direction and included in said second level plane to form a multi-level meshed structure of said lamps; and a second set of lamps provided under a bottom wall of said chamber, wherein said contact temperature sensors are electrically connected through a controller to said lamps to transmit signals indicating detected temperatures to said controller so that powers to be supplied to said lamps are controlled by said controller on the basis of said signals from said contact temperature sensors, and said controller independently controls individual powers to be supplied to said lamps on the basis of individual signals from said contact temperature sensors which individually detect temperatures said wafer at individual points onto which said lamps individually radiate.

27. The lamp anneal apparatus as claimed in claim 26, wherein said controller comprises a signal controller connected through signal transmission lines to said contact temperature sensors for controlling signals, and a power controller connected to said signal controller and also connected through power transmission lines to said lamps for controlling powers to be supplied through said power transmission lines to said lamps on the basis of signals controlled by said signal controller.

28. The lamp anneal apparatus as claimed in claim 26, wherein said wafer holder comprises a susceptor.

29. The lamp anneal apparatus as claimed in claim 26, wherein said wafer holder comprises a pedestal.

30. The lamp anneal apparatus of claim 26, wherein said wafer holder comprises a holder base that is positioned under the wafer, each of said temperature sensors having an exposed portion that extends above said holder base to support the wafer and a buried portion that is embedded within said holder base.

31. The lamp anneal apparatus of claim 30, wherein said temperature sensors are radially arrayed from a center of said holder base and spaced apart to detect temperatures at different radially arrayed points of the wafer.

* * * * *